(12) United States Patent
Nieminen

(10) Patent No.: US 7,839,310 B2
(45) Date of Patent: Nov. 23, 2010

(54) EXTENDED TURBO INTERLEAVERS FOR PARALLEL TURBO DECODING

(75) Inventor: Esko Nieminen, Oulu (FI)

(73) Assignee: Nokia Corporation, Espoo (FI)

( * ) Notice: Subject to any disclaimer, the term of this patent is extended or adjusted under 35 U.S.C. 154(b) by 37 days.

(21) Appl. No.: 12/378,998

(22) Filed: Feb. 19, 2009

(65) Prior Publication Data

US 2010/0207789 A1    Aug. 19, 2010

(51) Int. Cl.
H03M 7/00    (2006.01)

(52) U.S. Cl. .................. 341/81; 714/704; 714/755; 714/786; 714/799; 375/229; 375/263

(58) Field of Classification Search ............... 341/81, 341/82, 83; 714/755, 786, 704, 752, 799; 375/229, 263
See application file for complete search history.

(56) References Cited

U.S. PATENT DOCUMENTS

| | | | |
|---|---|---|---|
| 6,392,572 B1 * | 5/2002 | Shiu et al. ............... 341/81 |
| 6,516,437 B1 * | 2/2003 | Van Stralen et al. ...... 714/755 |
| 6,715,120 B1 | 3/2004 | Hladik et al. ........... 714/755 |
| 6,845,482 B2 * | 1/2005 | Yao et al. ............... 714/755 |
| 6,889,353 B2 * | 5/2005 | Nieminen ............... 714/786 |
| 7,058,874 B2 * | 6/2006 | Zhou .................... 714/756 |
| 7,127,656 B2 * | 10/2006 | Van Stralen et al. ...... 714/755 |
| 7,266,752 B2 * | 9/2007 | Yoon et al. .............. 714/774 |
| 7,333,419 B2 * | 2/2008 | Mukhopadhyay et al. ... 370/203 |
| 7,340,664 B2 * | 3/2008 | Shen .................... 714/755 |
| 7,363,552 B2 * | 4/2008 | Huang et al. ............ 714/702 |
| 7,386,766 B2 * | 6/2008 | Gao et al. ............... 714/702 |
| 2008/0301383 A1 | 12/2008 | Nieminen ............... 711/157 |
| 2009/0138668 A1 * | 5/2009 | Blankenship ............ 711/157 |
| 2009/0249171 A1 * | 10/2009 | Yago ..................... 714/786 |

OTHER PUBLICATIONS

"3rd Generation Partnership Project; Technical Specification Group Radio Access Network; Evolved Universal Terrestrial Radio Access (E-UTRA); Multiplexing and channel coding (Release 8)", 3GPP TS 36.212 V8.4.0, (Sep. 2008), 56 pgs.

(Continued)

Primary Examiner—Linh V Nguyen
(74) Attorney, Agent, or Firm—Harrington & Smith

(57) ABSTRACT

A first grouping of memory space addresses is generated for systematic bits of a received codeword; a second grouping of memory space addresses is generated for a first set of coding bits of the received codeword, wherein the first set of coding bits comprises an ascending order; and a third grouping of memory space addresses is generated for a second set of coding bits of the received codeword, wherein the second set of coding bits comprises an interleaved order. A sub-codeword of the received codeword is decoded in parallel by accessing the first set of coding bits using the addresses in the second grouping of memory spaces. In turn, another sub-codeword of the received codeword is decoded in parallel by accessing the second set of coding bits using the addresses in the third grouping of memory spaces. Apparatus and a memory storing a computer program are also detailed.

20 Claims, 8 Drawing Sheets

OTHER PUBLICATIONS

"3rd Generation Partnership Project; Technical Specification Group Radio Access Network; Multiplexing and channel coding (FDD) (Release 8)", 3GPP TS 25.212 V.8.3.0 (Sep. 2008), 104 pgs.

Valenti, Matthew C., et al., "Turbo Codes", Hadbook of RF and Wireless Technolgies, Sep. 25, 2003, pp. 375-399.

Giulietti, A., et al., "Parallel turbo coding interleavers: avoiding collisions in accesses to storage elements", IEEE, Electronics Letters, vol. 38, No. 5, Feb. 2002, pp. 232-234.

Tarable, Alberto, et al., "Mapping Interleaving Laws to Parallel Turbo and LDPC Decoder Architectures", IEEE Transactions On Information Theory, vol. 50, No. 9, Sep. 2004, pp. 2002-2009.

Tarable, Alberto, et al., "Mapping Interleaving Laws to Parallel Turbo Decoder Architectures", IEEE Communications Letters, vol. 8, No. 3, Mar. 2004, pp. 162-164.

Muller, Olivier, et al., "Exploring Parallel Processing Levels for Convolutional Turbo Decoding", IEEE 2006, pp. 2353-2358.

Benedetto, Sergio, et al., "Design issues in the implementation of versatile, high-speed iterative decoders", European Transactions on Telecommunications, vol. 18, No. 5, 2007, pp. 529-540.

* cited by examiner

FIG.4c

| | N MOD 4 | TOTAL LENGTH | \multicolumn{10}{c}{VALUES OF TE AT N, N+1, ..., N+9} |
|---|---|---|---|---|---|---|---|---|---|---|---|---|

| | N MOD 4 | TOTAL LENGTH | N | N+1 | N+2 | N+3 | N+4 | N+5 | N+6 | N+7 | N+8 | N+9 |
|---|---|---|---|---|---|---|---|---|---|---|---|---|
| ROW 1 | 2 | N+10 | N+6 | N+7 | N+8 | N+9 | N+4 | N+5 | N | N+1 | N+2 | N+3 |
| ROW 2 | 3 | N+9 | N+5 | N+6 | N+7 | N+8 | N+4 | N | N+1 | N+2 | N+3 | – |
| ROW 3 | 0 | N+8 | N+4 | N+5 | N+6 | N+7 | N | N+1 | N+2 | N+3 | – | – |
| ROW 4 | 1 | N+7 | N+3 | N+4 | N+5 | N | N+1 | N+2 | – | – | – | – |

FIG.4d

VALUES OF TE AT N, N+1, ..., N+17.

| N MOD 8 | TOTAL LENGTH | N | N+1 | N+2 | N+3 | N+4 | N+5 | N+6 | N+7 | N+8 | N+9 | N+10 | N+11 | N+12 | N+13 | N+14 | N+15 | N+16 | N+17 |
|---|---|---|---|---|---|---|---|---|---|---|---|---|---|---|---|---|---|---|---|
| 0 | N+16 | N+8 | N+9 | N+10 | N+11 | N+12 | N+13 | N+14 | N+15 | N | N+1 | N+2 | N+3 | N+4 | N+5 | N+6 | N+7 | – | – |
| 1 | N+15 | N+8 | N+9 | N+10 | N+11 | N+12 | N+13 | N+14 | N+7 | N | N+1 | N+2 | N+3 | N+4 | N+5 | N+6 | – | – | – |
| 2 | N+14 | N+8 | N+9 | N+10 | N+11 | N+12 | N+13 | N+6 | N+7 | N | N+1 | N+2 | N+3 | N+4 | N+5 | – | – | – | – |
| 3 | N+13 | N+7 | N+8 | N+9 | N+10 | N+11 | N+12 | N+6 | N | N+1 | N+2 | N+3 | N+4 | N+5 | – | – | – | – | – |
| 4 | N+12 | N+6 | N+7 | N+8 | N+9 | N+10 | N+11 | N | N+1 | N+2 | N+3 | N+4 | N+5 | – | – | – | – | – | – |
| 5 | N+11 | N+6 | N+7 | N+8 | N+9 | N+10 | N+5 | N | N+1 | N+2 | N+3 | N+4 | – | – | – | – | – | – | – |
| 6 | N+18 | N+10 | N+11 | N+12 | N+13 | N+14 | N+15 | N+16 | N+17 | N+8 | N+9 | N | N+1 | N+2 | N+3 | N+4 | N+5 | N+6 | N+7 |
| 7 | N+17 | N+9 | N+10 | N+11 | N+12 | N+13 | N+14 | N+15 | N+16 | N+8 | N | N+1 | N+2 | N+3 | N+4 | N+5 | N+6 | N+7 | – |

US 7,839,310 B2

EXTENDED TURBO INTERLEAVERS FOR PARALLEL TURBO DECODING

TECHNICAL FIELD

The exemplary and non-limiting embodiments of this invention relate generally to wireless communication systems, methods, devices and computer programs and, more specifically, relate to techniques for decoding channel codes used for forward error correction.

BACKGROUND

This section is intended to provide a background or context to the invention that is recited in the claims. The description herein may include concepts that could be pursued, but are not necessarily ones that have been previously conceived or pursued. Therefore, unless otherwise indicated herein, what is described in this section is not prior art to the description and claims in this application and is not admitted to be prior art by inclusion in this section.

During operation of a wireless communication system when transmitting data it is necessary to decode various channel codes that are used for forward error correction. These protect the transmitted signal from interference and also eliminate interference-induced errors in the signal.

One widely used encoding method is convolutional coding. In the convolutional coding the signal to be transmitted, consisting of symbols, is encoded into code words which are based on the convolution of the original signal with code polynomials. The convolutional code is determined by the coding rate and the coding polynomials. The coding rate (k/n) refers to the number (n) of produced coded symbols in relation to the number (k) of symbols to be coded.

An encoding method further developed from the convolutional code is a parallel concatenated convolutional code PCCC, which is also known as a turbo code. A PCCC may be generated from two recursive systematic convolutional encoders and an interleaver. The convolutional encoders can be identical or different. The resulting code includes a systematic part which corresponds directly to the symbols at the encoder input and two parity components which are the outputs of the parallel convolutional encoders. Typical channel codes, such as those used in 3G systems and WiMAX, are turbo codes, duo-turbo codes, and low density parity check (LDPC) codes. Various different wireless communication systems employ decoders and interleavers (sometimes termed de-interleavers) for the decoding of channel codes. The relevant decoders are often disposed within modems (modulator/demodulator), though in some embodiments they may be a hardware component separate from the modem itself. As throughput increases, there is a need to provide for faster decoding.

SUMMARY

The foregoing and other problems are overcome, and other advantages are realized, by the use of the exemplary embodiments of this invention.

In an exemplary embodiment of this invention there is provided a method that comprises generating a first grouping of memory space addresses for systematic (soft) bits of a received codeword, generating a second grouping of memory space addresses for a first set of (soft) coding bits of the received codeword, in which the first set of coding bits comprises an ascending order, and generating a third grouping of memory space addresses for a second set of (soft) coding bits of the received codeword, in which the second set of coding bits comprises an interleaved order. The method continues with decoding a (first) sub-codeword of the received codeword in parallel by accessing the first set of (soft) coding bits using the addresses in the second grouping of memory spaces and in turn decoding another (a second) sub-codeword of the received codeword in parallel by accessing the second set of (soft) coding bits using the addresses in the third grouping of memory spaces.

In another exemplary embodiment of this invention there is provided an apparatus. The apparatus includes a memory that comprises a first grouping of memory space addresses at which are stored systematic (soft) bits of a received codeword, a second grouping of memory space addresses at which are stored a first set of (soft) coding bits of the received codeword in an ascending order, and a third grouping of memory space addresses at which are stored a second set of (soft) coding bits of the received codeword in an interleaved order. The apparatus also comprises a first decoder (e.g., a first decoder mode) configured to decode a (first) sub-codeword of the received codeword in parallel using the first set of (soft) coding bits retrieved from the second grouping of memory spaces, and a second decoder (e.g., a second decoder mode) configured to decode, in turn with the first decoder/mode and in parallel access to the memory space addresses (e.g., in parallel within a sub-codeword), another (a second) sub-codeword of the received codeword using the second set of (soft) coding bits retrieved from the third grouping of memory spaces.

In still another exemplary embodiment of the invention there is a computer readable memory storing a program of executable instructions that when executed by a processor perform actions directed to decoding a codeword, the actions comprising: generating a first grouping of memory space addresses for systematic bits of a received codeword; generating a second grouping of memory space addresses for a first set of coding bits of the received codeword, wherein the first set of coding bits comprises an ascending order; generating a third grouping of memory space addresses for a second set of coding bits of the received codeword, wherein the second set of coding bits comprises an interleaved order; and decoding a sub-codeword of the received codeword in parallel by accessing the first set of coding bits using the addresses in the second grouping of memory spaces and in turn decoding another sub-codeword of the received codeword in parallel by accessing the second set of coding bits using the addresses in the third grouping of memory spaces.

In a further exemplary embodiment there is an apparatus comprising storage means (e.g., a computer readable memory) and decoding means (e.g., two or more decoder modes or two or more decoders). The storage means is for storing a first arranging a first grouping of memory space addresses at which are stored systematic bits of a received codeword, a second grouping of the memory space addresses at which are stored a first set of coding bits of the received codeword in an ascending order, and a third grouping of memory space addresses at which are stored a second set of coding bits of the received codeword in an interleaved order. The decoding means is for decoding a sub-codeword of the received codeword in parallel using the first set of coding bits retrieved from the second grouping of memory spaces, and for decoding, in turn with the decoding of the first sub-codeword and in parallel access to the memory space addresses, another sub-codeword of the received codeword using the second set of coding bits retrieved from the third grouping of memory spaces.

BRIEF DESCRIPTION OF THE DRAWINGS

FIG. 4c is a table showing four different cases of populating the extended memory spaces of an interleaver according to exemplary embodiments of the invention using quadruple accesses for decoding.

FIG. 4d is a table showing eight different cases of populating the extended memory spaces of an interleaver according to exemplary embodiments of the invention using 8-tuple accesses for decoding.

DETAILED DESCRIPTION

Turbo interleavers according to the exemplary embodiments of the invention presented herein may be employed in networks that operate using wireless protocols, such as for example, 3G (e.g., cdma2000, wideband code division multiple access WCDMA), WiMAX (worldwide interoperability for microwave access), LTE, and high speed downlink/uplink packet access (HSDPA/HSUPA). Embodiments of this invention are not limited to a particular wireless protocol, and may be employed in mobile devices/user equipment and/or network elements such as base stations/Node B's and the like.

In turbo decoders the degree of internal parallel processing/access can be a power of two, that is, $n=2^m$, where $m=1$, 2, 3, and so on. A length of a turbo interleaver may not be a multiple of the degree of applied parallel processing. Then the problem is how to adjust a length of a turbo interleaver to be a multiple of the degree of parallel processing. Furthermore, tail data values require special attention because they are not within a range of a turbo interleaver. Exemplary embodiments of this invention relate to adjusting of a length of a turbo interleaver to be a multiple of the degree of parallel processing. Such exemplary embodiments are useful for turbo decoders of high speed data connections, such as those based on the 3G system (e.g., 3GPP TS 25.212) with interference cancellation. That specification stipulates 5075 turbo interleavers from 40 to 5114. There is need for adjusting them to be a multiple of n, the degree of parallel processing, with tail data values.

Exemplary embodiments of the invention construct an auxiliary turbo interleaver whose length is a multiple of n (the degree of parallel processing/access) such that two sets of tail samples are in different n-tuples. Then it is possible to solve parallel access contentions with the extended turbo interleaver and treat tail data values properly simultaneously. Moreover, both sub code words of turbo codes can be decoded in the same way.

Figure 1:
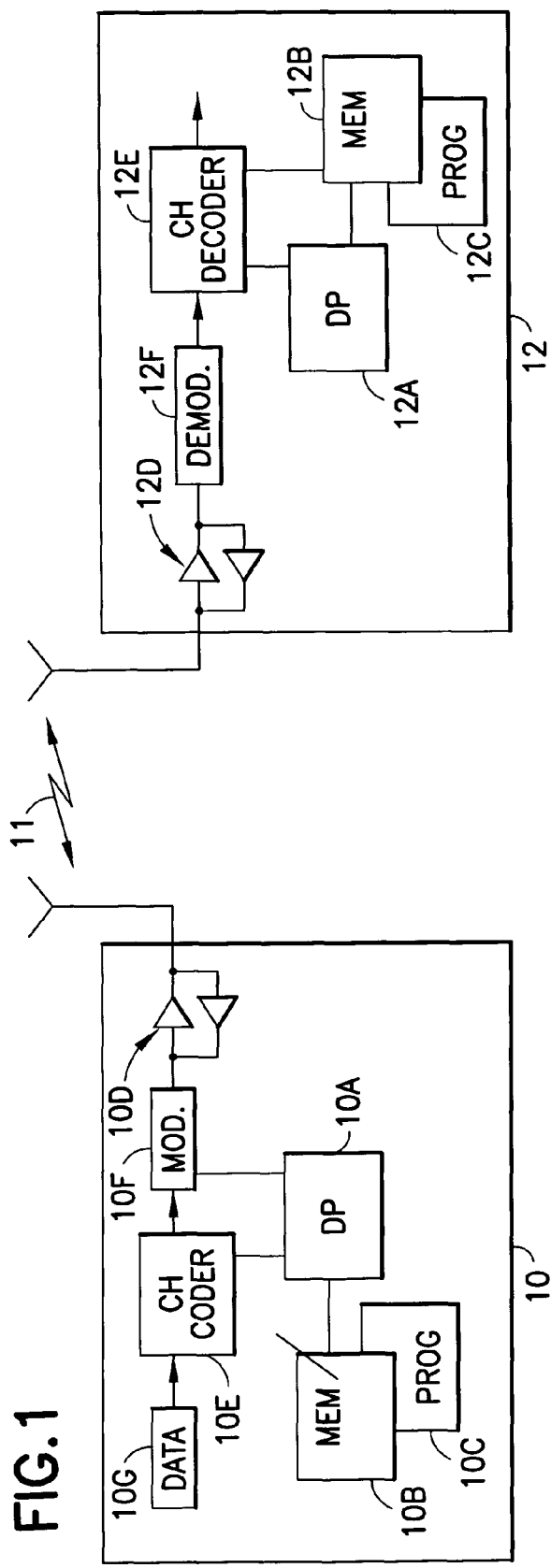
FIG. 1 shows a simplified block diagram of various electronic devices that are suitable for use in practicing the exemplary embodiments of this invention.

First consider FIG. 1 which shows a transmitter 10 and receiver 12 as an exemplary environment in which embodiments of the invention may be employed. The transmitter 10 and the receiver 12 communicate by means of a radio channel 11. The transmitter 10 includes a controller, such as a computer or a data processor (DP) 10A, a computer-readable memory medium embodied as a memory (MEM) 10B that stores a program of computer instructions (PROG) 10C, and a suitable radio frequency (RF) transceiver 10D for bidirectional wireless communications with the transmitter 12 via one or more antennas (one shown at FIG. 1). The transmitter 10 further includes a data source 10G, which can be as a non-limiting example a speech encoder. The output of the data source 10G provides a signal which is applied to a channel encoder 10E, which in this case is a convolutional coder, preferably a turbo coder. The encoded symbols output from the channel coder 10E are applied to a modulator 10-F where the signal is modulated in a known manner. The modulated signal is applied to a radio frequency RF front end 10D, where it is amplified and transmitted to the radio path 11 by means of the antenna. In certain embodiments the modulator 10F may be incorporated into the RF front end 10D.

On the radio path 11, the signal is subjected to interference and noise. The receiver 12 also includes a controller, such as a computer or a data processor (DP) 12A, a computer-readable memory medium embodied as a memory (MEM) 12B that stores a program of computer instructions (PROG) 12C, and a suitable RF transceiver 12D for communication with the transmitter 10 via one or more antennas (one shown). The receiver 12 receives the signal from its antenna and applies it to the radio frequency front end 12D and to a demodulator 12F (as with the transmitter, the demodulator in the receiver 12 may be a part of the RF front end 12D in some embodiments). The demodulated signal is applied to a channel decoder 12E, where the signal is decoded according to the exemplary embodiments of the invention detailed below. From the decoder 12E the decoded signal is further applied to other components of the receiver (not shown).

In an embodiment, one of the transmitter and receiver is embodied as a user equipment UE and the other of the transmitter and receiver is embodied as an access node, such as for example a base station, a WLAN access point, or the like. In another embodiment both transmitter and receiver are embodied as UEs.

At least one of the PROGs 10C and 12C is assumed to include program instructions that, when executed by the associated DP, enable the device to operate in accordance with the exemplary embodiments of this invention, as will be discussed below in greater detail.

That is, the exemplary embodiments of this invention may be implemented at least in part by computer software executable by the DP 10A of the transmitter 10 and/or by the DP 12A of the receiver 12, or by hardware, or by a combination of software and hardware (and firmware).

In general, the various embodiments of the transmitter 10 and/or receiver 12 can include, but are not limited to, cellular telephones, personal digital assistants (PDAs) having wireless communication capabilities, portable computers having wireless communication capabilities, image capture devices such as digital cameras having wireless communication capabilities, gaming devices having wireless communication capabilities, music storage and playback appliances having wireless communication capabilities, Internet appliances permitting wireless Internet access and browsing, as well as portable units or terminals that incorporate combinations of such functions.

The computer readable MEMs 10B and 12B may be of any type suitable to the local technical environment and may be implemented using any suitable data storage technology, such as semiconductor based memory devices, flash memory, magnetic memory devices and systems, optical memory devices and systems, fixed memory and removable memory. The DPs 10A and 12A may be of any type suitable to the local technical environment, and may include one or more of general purpose computers, special purpose computers, microprocessors, digital signal processors (DSPs) and processors based on a multicore processor architecture, as non-limiting examples.

Figure 2A:
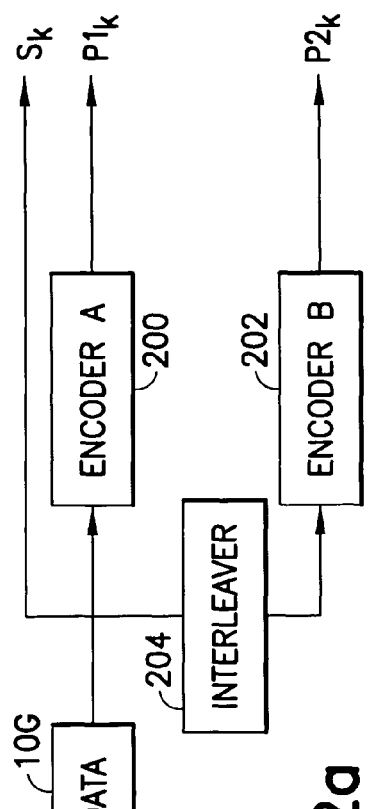
FIG. 2a shows a conventional turbo encoder arrangement in a transmitter.

FIG. 2a illustrates further detail of the structure of a typical turbo coder. The encoder comprises two encoders 200, 202 and an interleaver 204 which is denoted by T. The signal to be coded (from the transmitter data source 10G) is applied as such to the encoder output. This component is called a systematic part S of the code. The signal to be coded is also applied as such to a first encoder A 200 and an interleaver 204. The interleaved signal is applied to a second encoder B 202. The output signal P1 of the first encoder 200 and the output signal P2 of the second encoder 202 are called parity components of the code; P1 is a parity of the ascending order and P2 is a parity of the interleaved order. The ascending order refers to the address order in which the bits enter the encoder A 200. The interleaved order is the order in which the bits enter the encoder B 202. The encoders A and B can be either identical or different. They have a prior art structure. Besides a systematic component S 220 and parity components P1 222 and P2 224, the two turbo encoders output two sets of tail bits 226, 228 and 230, 232 when the component encoders are returned to the zero state. The two turbo encoders 200, 202 are fetched to the zero state one by one such that other one is disabled when the other is fetched to the zero state. Further details for a method to fetch an encoder to the zero state is explained e.g. in 3GPP TS 25.212.

Figure 2B:
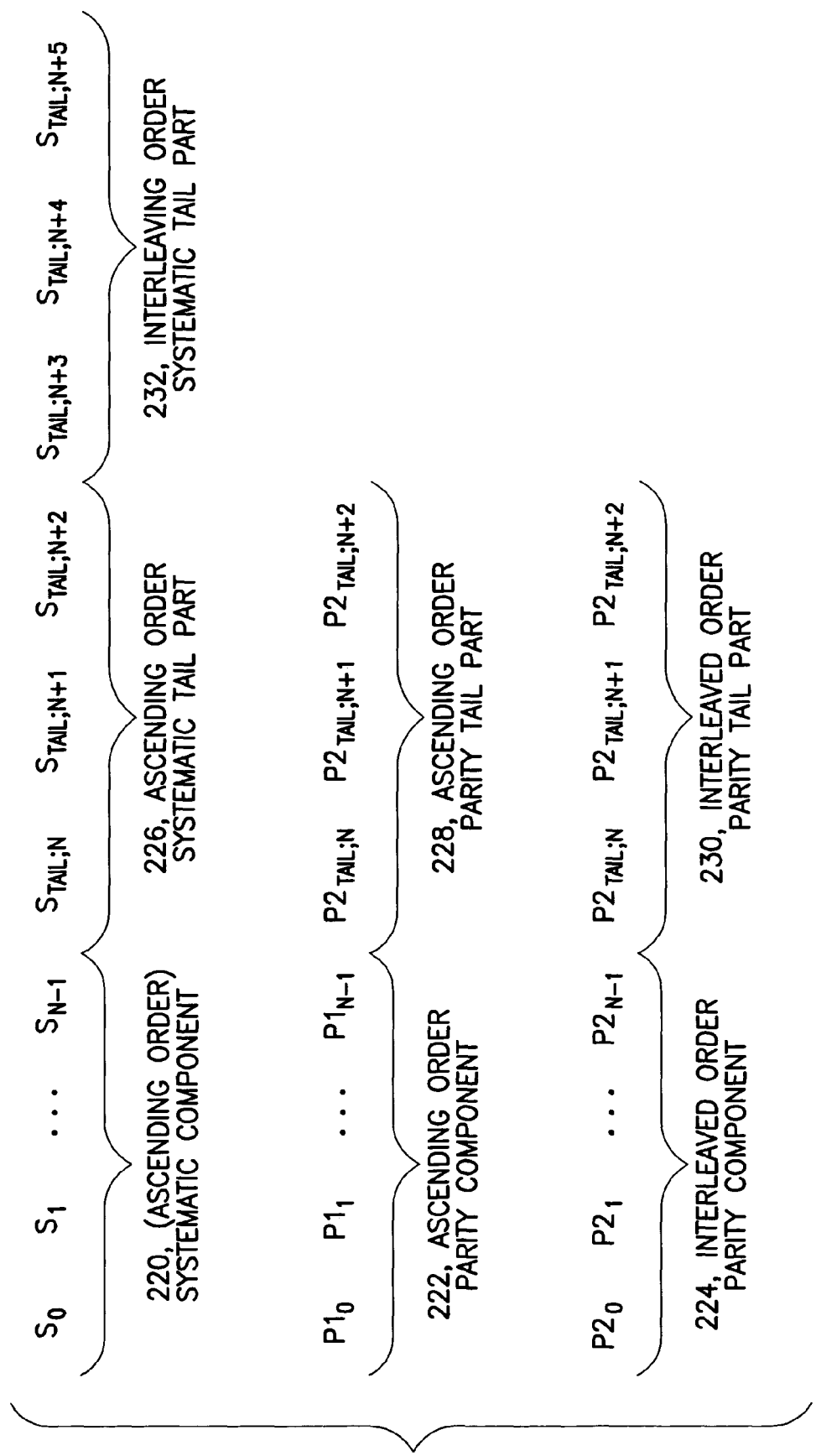
FIG. 2b shows a partition of a turbo codeword into seven internal parts.

Assume that the original signal to be encoded $S_k$ equals N bits, k=0, 1, 2 ..., N−1, and there are three tail bits added by each of the encoders 200, 202. In other words, each component encoder is an 8-state systematic recursive convolution encoder. The transmitted codeword may be considered to be in seven parts or components as shown in FIG. 2b. A systematic component which is the uncoded systematic bits $S_k$ 220 and which is N bits long; an ascending order systematic tail part 226 from the first encoder 200 which consists of three bits and denoted by $S_{Tail;N}$, $S_{Tail;N+1}$, and $S_{Tail;N+2}$; an interleaved order systematic tail part 232 from the second encoder 202 which consists of three bits and denoted by $S_{Tail;N+3}$, $S_{Tail;N+4}$, and $S_{Tail;N+5}$; an ascending order parity component which is output bits $P1_k$ 222 from the first encoder 200 and which is N bits long; an ascending order parity tail part 228 from the first encoder 200 which is three bit long and denoted by $P1_{Tail;N}$, $P1_{Tail;N+1}$, and $P1_{Tail;N+2}$; an interleaved order parity component which is output bits $P2_k$ 224 from the second encoder 202 and which is also N bits long, and an interleaved order parity tail part 230 from the second encoder 202 which is three bit long and denoted by $P2_{Tail;N}$, $P2_{Tail;N+1}$, and $P2_{Tail;N+2}$. The full codeword which the transmitter has after turbo encoding is then of length (N)+(3)+(3)+(N)+(3)+(N)+(3)=3N+12, where the lengths of the different components are in the same order as explained above and a coding rate is N/(3N+12). The seven components of the codeword are illustrated in FIG. 2b. A transmitter may further process the codeword before sending it.

It follows from the component encoders that a turbo codeword may consist of two sub codewords. A first sub codeword is an ascending order systematic 220, parity 222, systematic tail 226, and parity tail bits 228. The first sub codeword is generated by the first encoder 200. A second sub codeword is an interleaved order systematic $S_{T[k]}$ (not shown in FIG. 2b), parity 224, systematic tail 232, and parity tail bits 230. The second sub codeword is generated by the second encoder 202. The interleaved systematic bits $S_{T[k]}$ are ignored and hence not transmitted because they can be regenerated from ascending order systematic bits by interleaving.

Figure 3:
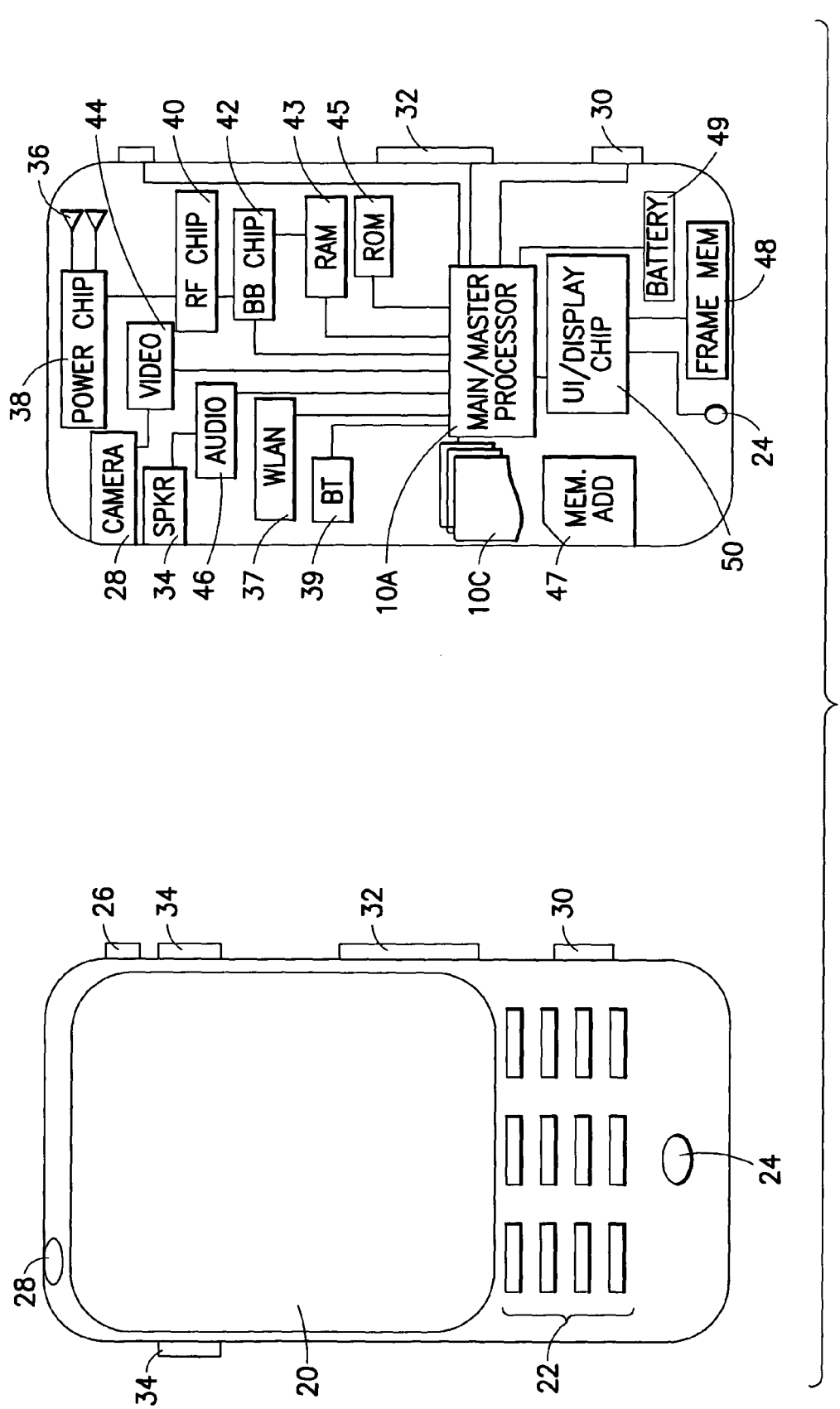
FIG. 3 is a more detailed schematic diagram of the transmitter and receiver from FIG. 1.

FIG. 3 illustrates further detail of an exemplary transmitter 10 and/or receiver 12 embodied as a UE, in both plan view (left) and sectional view (right). Exemplary embodiments of the invention may be embodied in one or some combination of those more function-specific components. At FIG. 3 the UE has a graphical display interface 20 and a user interface 22 illustrated as a keypad but understood as also encompassing touch-screen technology at the graphical display interface 20 and voice-recognition technology received at the microphone 24. A power actuator 26 controls the device being turned on and off by the user. The exemplary UE 10 may have a camera 28 which is shown as being forward facing (e.g., for video calls) but may alternatively or additionally be rearward facing (e.g., for capturing images and video for local storage). The camera 28 is controlled by a shutter actuator 30 and optionally by a zoom actuator 30 which may alternatively function as a volume adjustment for the speaker(s) 34 when the camera 28 is not in an active mode.

Within the sectional view of FIG. 3 are seen multiple transmit/receive antennas 36 that are typically used for cellular communication. The antennas 36 may be multi-band for use with other radios in the UE. The operable ground plane for the antennas 36 is shown by shading as spanning the entire space enclosed by the UE housing though in some embodiments the ground plane may be limited to a smaller area, such as disposed on a printed wiring board on which the power chip 38 is formed. The power chip 38 controls power amplification on the channels being transmitted and/or across the antennas that transmit simultaneously where spatial diversity is used, and amplifies the received signals. The power chip 38 outputs the amplified received signal to the radio-frequency (RF) chip 40 which demodulates and downconverts the signal for baseband processing. The baseband (BB) chip 42 detects the signal which is then converted to a bit-stream and finally decoded. Similar processing occurs in reverse for signals generated in the apparatus 10 and transmitted from it.

Signals to and from the camera 28 pass through an image/video processor 44 which encodes and decodes the various image frames. A separate audio processor 46 may also be present controlling signals to and from the speakers 34 and the microphone 24. The graphical display interface 20 is refreshed from a frame memory 48 as controlled by a user interface chip 50 which may process signals to and from the display interface 20 and/or additionally process user inputs from the keypad 22 and elsewhere.

Certain embodiments of the UE 10 may also include one or more secondary radios such as a wireless local area network radio WLAN 37 and a Bluetooth® radio 39, which may incorporate an antenna on-chip or be coupled to an off-chip antenna. Throughout the apparatus are various memories such as random access memory RAM 43, read only memory ROM 45, and in some embodiments removable memory such as the illustrated memory card 47 on which the various programs 10C are stored. All of these components within the UE 10 are normally powered by a portable power supply such as a battery 49.

The aforesaid processors 38, 40, 42, 44, 46, 50, if embodied as separate entities in a transmitter 10 or receiver 12 (either of which may be a UE or a network access node/relay node), may operate in a slave relationship to the main processor 10A, 12A, which may then be in a master relationship to them. Embodiments of this invention are most relevant to the baseband processor 42, though it is noted that other embodiments need not be disposed there but may be disposed across various chips and memories as shown or disposed within another processor that combines some of the functions described above for FIG. 3. Any or all of these various processors of FIG. 3 access one or more of the various memories, which may be on-chip with the processor or separate therefrom. Similar function-specific components that are directed toward communications over a network broader than a piconet (e.g., components 36, 38, 40, 42-45 and 47) may also be disposed when the transmitter 10 and/or receiver 12 is embodied as a network access node, which may have an array of tower-mounted antennas rather than the two shown at FIG. 3.

Note that the various chips (e.g., 38, 40, 42, etc.) that were described above may be combined into a fewer number than described and, in a most compact case, may all be embodied physically within a single chip.

Figure 2C:
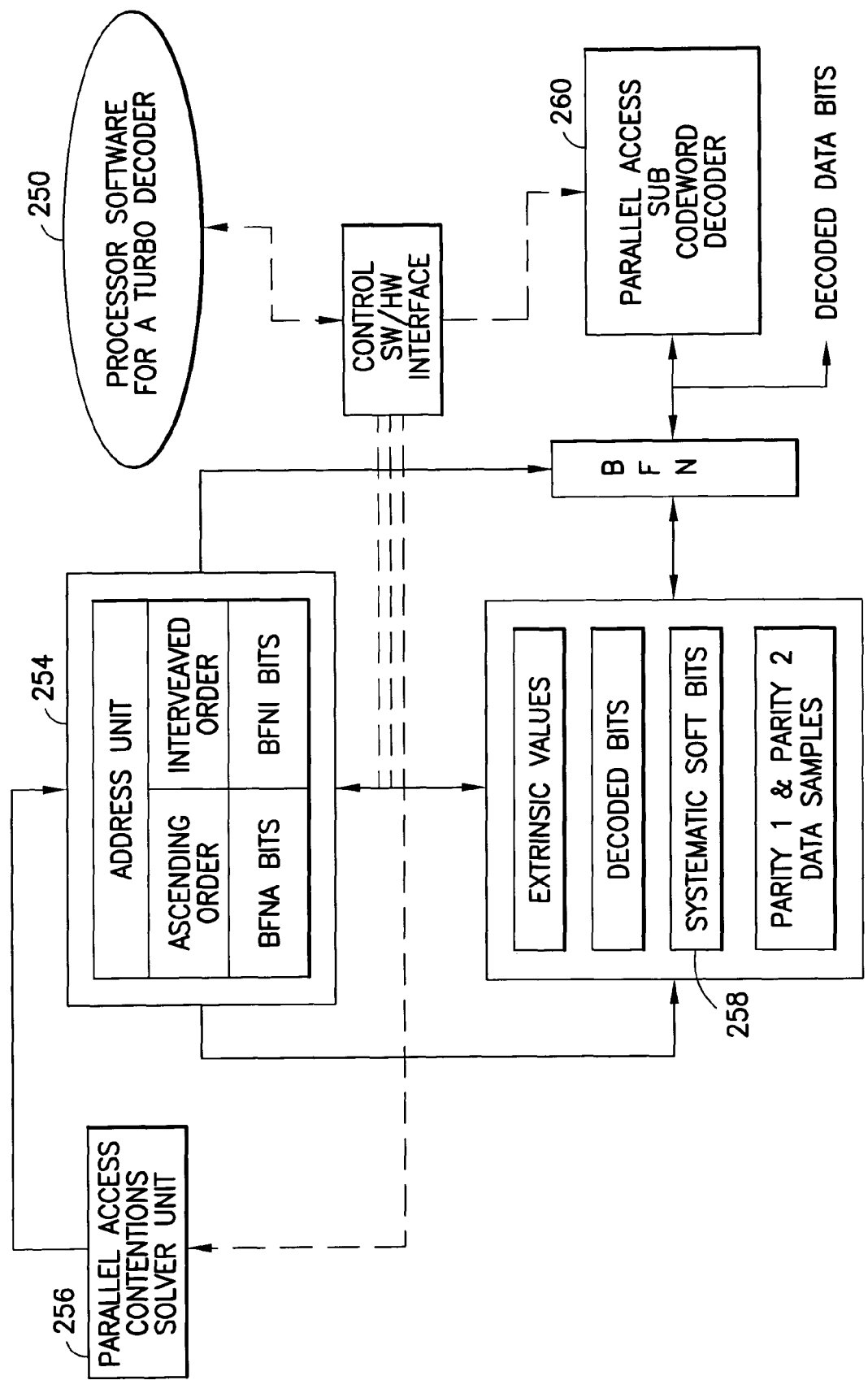
FIG. 2c illustrates an exemplary parallel access sub turbo decoder that can be used by after applying an exemplary embodiment of the invention to a turbo interleaver.

Usually the receiver 12 processes a received signal such that it is able to detect and reconstruct original data bits that a transmitter sent after several encoding steps of which one may be a turbo encoder. An inverse operation of turbo encoding is turbo decoding that a receiver may execute to deduce original data bits from received data. Typically received codewords are represented in soft bits which are quantized values for each received data bit. Hence a bit of a codeword of a transmitter may be represented in a soft value at a receiver. A common algorithm to decode turbo encoded data is called MaxLogApp. A guiding principle of the MaxLogApp-algorithm is to decode two sub codewords of a turbo codeword in turns and derive from a sub codeword and previous extrinsic values new extrinsic values to be passed as input to a next sub decoding round. Such a sub codeword decoder is shown in FIG. 2c with the butterfly network BFN for parallel access of data. When applying a turbo decoder with internal parallel processing/access one has to solve parallel access contentions in two access orders: ascending order and interleaved order. Relevant teachings in this regard may be seen at co-owned U.S. patent application Ser. No. 11/810,119, filed on Jun. 4, 2007 and entitled "Multiple Access for Parallel Turbo Decoder". However, a length of a turbo interleaver may not be a multiple of the degree of applied parallel processing, that is, $N \neq cn$, c is a constant and $n=2^m$, where m=1, 2, 3, and so on. Moreover, it is advantageous to take into account soft tail bits of a received turbo codeword at the same time.

Figure 4A:
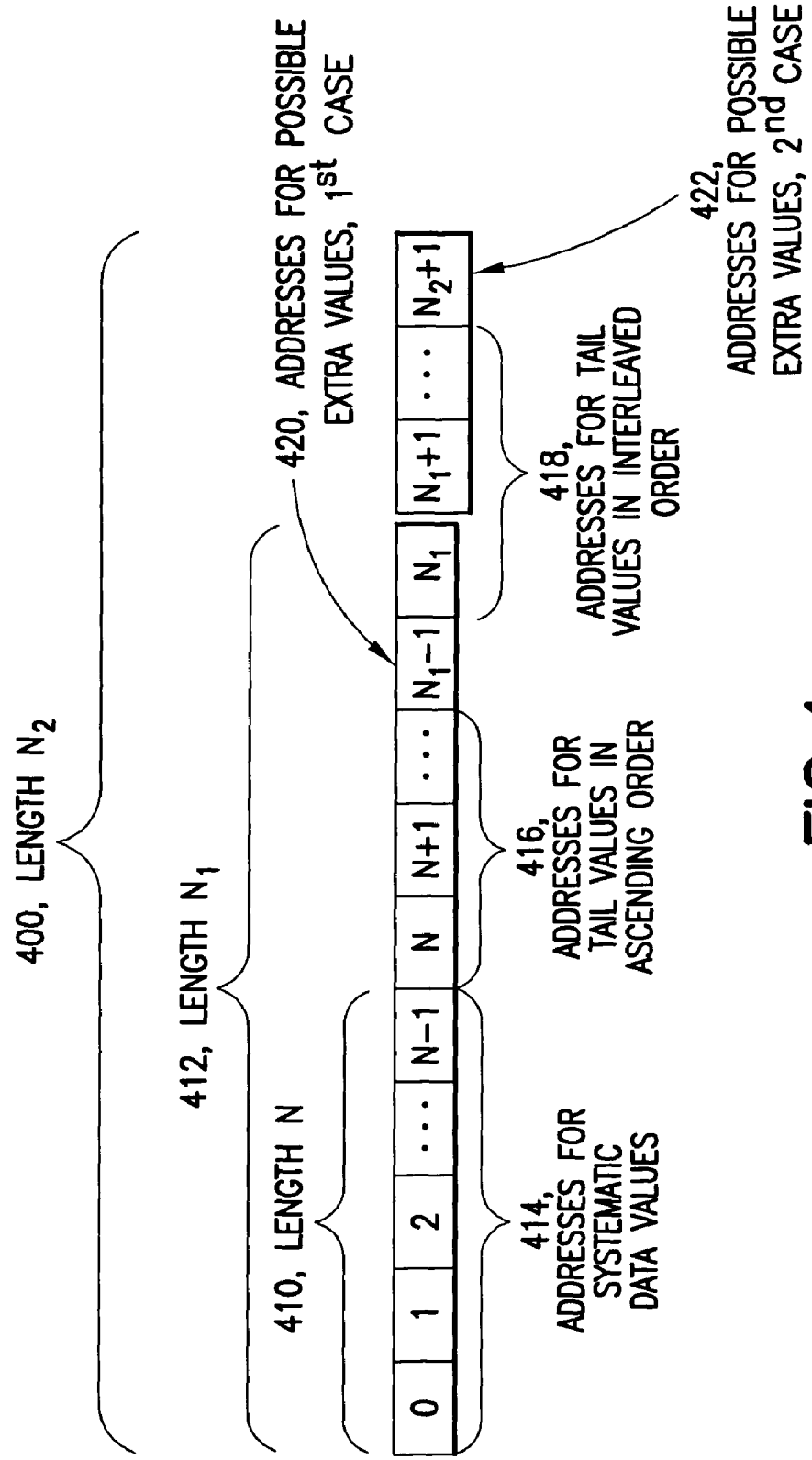
FIG. 4a is schematic diagram showing further detail of two extended address spaces according to an exemplary embodiment of the invention.

FIG. 4a depicts the arrangement to extend an original ascending order address space. The address space of the systematic tail bits in the ascending order 416 follows the addresses 444 of the systematic bits $S_k$ (which did not pass through either of the encoders 200, 202 of the transmitter 10 shown at FIG. 2). A number 410 of the addresses of the systematic bits $S_k$ is N. If the n-tuple of the last tail sample is not full, then extra data values 420 may be used to fill the n-tuple until the next n-tuple of data values begins. A length of the first extended address space 412 is denoted by $N_1$. The address space of the systematic tail bits in the interleaved order 418 follows the addresses of the systematic tail bits in the ascending order by beginning from the next free n-tuple. Also in this case the last n-tuple is filled by extra data values 422 if needed. A length of the second extended address space 400 is denoted by $N_2$. There may be unused memory spaces in both extended address spaces (since for different codewords the length N may be different), in which case there are additional memory spaces within the total length of these extended address spaces that are occupied by extra data values to fill until the next n-tuple of data values begin, where n is the degree of parallel access. The original address space 410 has N addresses, the first extended address space 412 has $N_1$ addresses, and the second extended address space 400 has $N_2$ addresses. It follows that the lengths $N_1$ and $N_2$ of the first and second address space are multiples of the degree of applied parallel processing, that is, $N_1=c_1 n$ and $N_2=c_2 n$ for some constants $c_1$ and $c_2$. Also $N \leq N_1 \leq N_2$. In general, the numbers $N_1$ and $N_2$ can be calculated by the following procedure. The number $N_1$ is the least integer number such that $N_1$ is a multiple of a degree of parallel processing/access and $N_1-N$ is bigger or equal to a maximum number of tail bits of sub-codewords. The number $N_2$ is the least integer number such that $N_2$ is a multiple of a degree of parallel processing/access and $N_2-N_1$ is bigger or equal to a maximum number of tail bits of sub-codewords. Because an ascending order sub codeword is terminated by ascending order tail data values, we may execute decoding of the ascending order sub codeword using the first extended address space of $N_1$ addresses. The next step is to extend a turbo interleaver to match with the first and second extended address spaces. In particular, it is required that the extended turbo interleaver is able to fetch both data values of an original interleaved sub codeword and interleaved tail values properly for decoding of an interleaved order sub codeword.

Figure 4B:
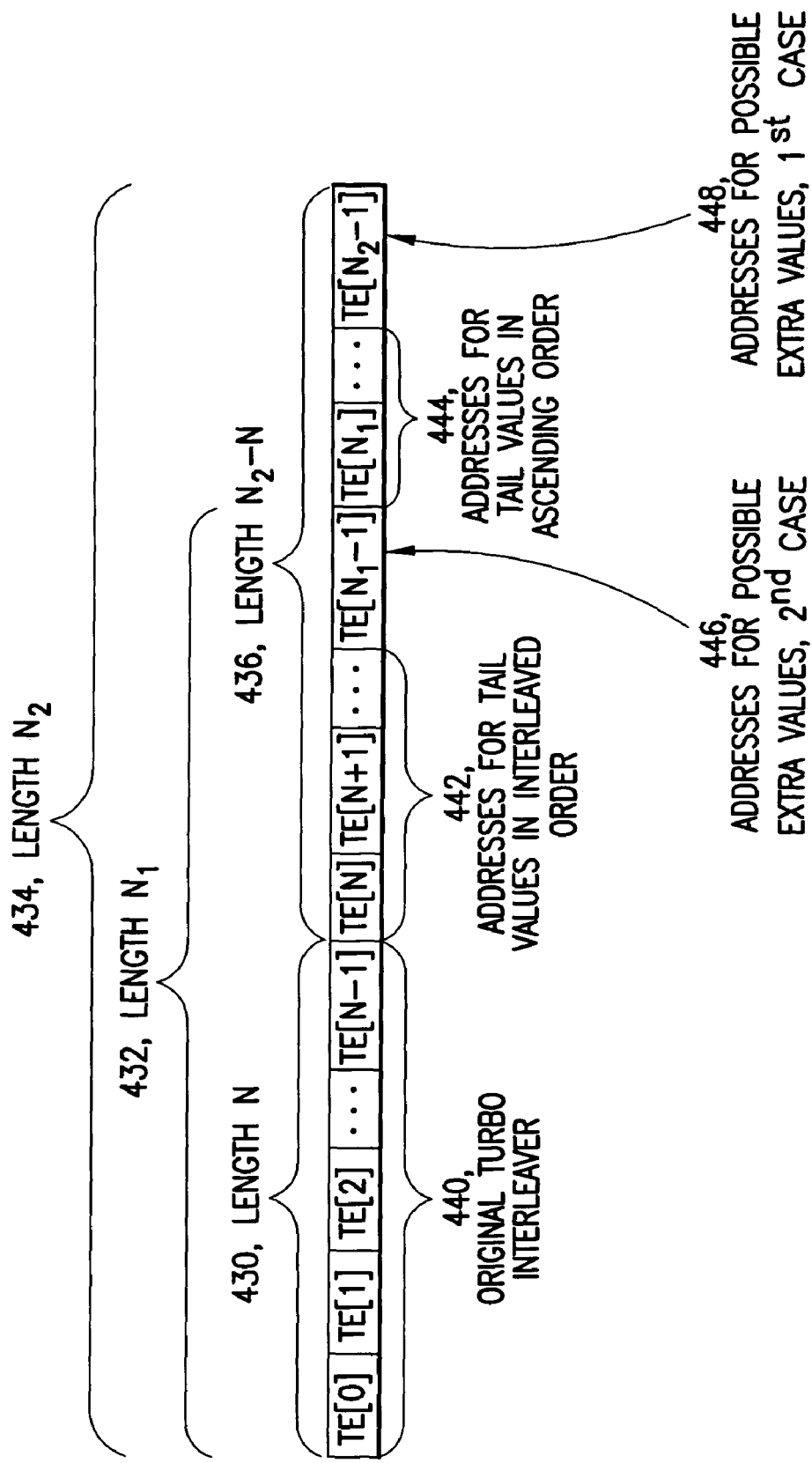
FIG. 4b shows principles to extent a turbo interleaver so that the extended interleaver may co-operate with the extended address spaces in FIG. 4a according to an exemplary embodiment of the invention.

FIG. 4b illustrates the arrangement of the address spaces of the extended-length interleaver and the values that fill them. Assume as a particular but non-limiting example parallel access turbo decoders for a modem supporting a 3G wireless system (e.g., 3GPP TS 25.212). If the length of the conventional turbo interleaver T is denoted as N 430 and we further assume that there are three tail bits appended to each encoded sub-codeword (e.g., each component of the overall codeword output from an encoder as in FIG. 2a), then we may denote the length of the extended interleaver TE as $N_2$ 434. So the extended (turbo) interleaver TE is applied over the second extended address space. N is the integer number of systematic bits, the number output on line $S_k$ at FIG. 2a.

The actual number of addresses of the extended length $N_2$ 434 interleaver TE depends on the degree of parallel access being employed, a number of tails bits, and also on the length N as is detailed further below. As seen at FIG. 4b, the N addresses of an original turbo interleaver 440 are placed in the first N address positions 430 of the overall length $N_2$ extended length interleaver TE. Following the length N portion 430 of the original interleaver address spaces is another portion 436 of length $N_2-N$. In the positions immediately following the original interleaver are then placed the addresses of the tail values in the interleaved order 442 and some extra values 446 to fill an n-tuple full. After those are placed the addresses of the tail values in the ascending order 444 and other set of possible extra values 448 to fill an n-tuple full. The lengths $N_1$ and $N_2$ in FIG. 4b are equal to those of the first and second extended address space in FIG. 4a, respectively.

As pointed out above, a turbo decoder with internal parallel processing/access requires solved parallel access contentions in two access orders: ascending order and interleaved order. Now we have defined two types of extended address schemes having the length $N_2$ that is a multiple of a degree of parallel processing. Therefore we may establish an n-tuple parallel access turbo decoder with the second extended address space and the extended turbo interleaver, for example by invoking the methods of the U.S. patent application Ser. No. 11/810, 119, filed on Jun. 4, 2007 and entitled "Multiple Access for Parallel Turbo Decoder". The parallel access sub turbo decoder may apply the first extended address space 412 for decoding an ascending order sub codeword and the extended interleaver TE until the $N_1$:th address 432. So the parallel access sub turbo decoder uses $N_1$ addresses out of $N_2$ for data accesses. The reason for this is the fact that two types of tail bits are generated without use of the original turbo interleaver. If decoded properly with n-tuple parallel access, the ascending order values $S_k$ 220, 226 match, in order, those parity values 222, 228 output from the first encoder 200 of the transmitter 10 and the interleaved order values $S_{T[k]}$ and 232 match, in order, those parity values output 224, 230 from the second encoder 202 of the transmitter 10.

It can be seen from FIG. 4b that for the original (turbo) interleaver memory addresses in the range $0, 1, 2, \ldots, N-1$, the extended length turbo interleaver 434 is equal to T, TE[i]=T[i] for $i=0, 1, 2, \ldots, N-1$. The addresses of the systematic tail data values of an interleaved order sub-codeword are put right after the addresses of the N systematic data values as seen at 442. In other words, TE[N+k]=$N_1$+k for k=0, 1, 2, assuming three tail bits. If needed, some extra data addresses values 446 are inserted to fill a last n-tuple full. In FIG. 4b these extra data values would be dummy values inserted into memory spaces indicated by reference number 446. Then the addresses of the systematic tail data values of an ascending order sub-codeword are put by starting by a next free n-tuple by TE[$N_1$+k]=N+k for k=0, 1, 2, (assuming three tail bits also), as shown at FIG. 4b as reference number 444. Also, if needed, some extra data values are inserted to fill a last n-tuple full, which would in FIG. 4b be dummy values 448 in memory spaces to the right of 444 but still within the overall length $N_2$ of the extended length interleaver 434. There are several possibilities to assign extra dummy addresses. All of them have to meet the requirement the extended length turbo interleaver TE has an inverse interleaver.

As a particular example, consider first the simpler case where the degree of parallel access is n=2. There are two different cases to consider, based on the number N of systematic bits, when the degree of parallel access is two: where N is even and where N is odd.

If N is even, then a total length 434 $N_2$ of the extended interleaver TE is $N_2$=N+8 and $N_1$=N+4. Therefore three addresses of the interleaved order soft tail bits are given by TE[N+k]=$N_1$+k=N+4+k for k=0, 1, 2; and the three addresses of the ascending order soft tail bits are TE[$N_1$+k]=N+k for k=0, 1, 2. In this case two dummy addresses are needed to fill remaining 2-tuples full. A missing dummy address may be set by TE[N+3]=$N_1$+3=N+7 and other missing dummy address may be given by TE[$N_1$+3]=N+3. Other possibility to reset two dummy addresses are TE[N+3]=N+3 and TE[$N_1$+3]= $N_1$+3=N+7. When N is odd, then a total length of TE is $N_2$=N+7 and $N_1$=N+3. The last seven values of the extended turbo interleaver are TE[N+k]=N+3+k for k=0, 1, 2; and TE[$N_1$+k]=N+k for k=0, 1, 2, and a dummy address by TE[N+6]=N+6. These give the ascending order and the interleaved order addresses for the tail bits, so that the 2-tuple parallel access sub decoder in FIG. 2c accessing the respective groups 442, 446 of the extended length interleaver 434 in the range $\{0, 1, \ldots, N_1\}$ can read the proper tail values in the proper order so as to decode their respective sub-codeword in turns.

The values of the extended portion of the interleaver for n=2-tuple access are summarized in table 1 below. Addresses of interleaved order soft tail bits are shown in boldface in table 1. Addresses of ascending order soft tail bits are shown in italic in table 1.

TABLE 1

| 3 tail bits and n = 2-tuple access for N = even and N = odd | | | | | | | | |
|---|---|---|---|---|---|---|---|---|
| | Total | Values of TE at N, N + 1, . . . , N + 7 | | | | | | |
| N | Length | N | N + 1 | N + 2 | N + 3 | N + 4 | N + 5 | N + 6 | N + 7 |
| Even | N + 8 | N + 4 | N + 5 | N + 6 | N + 7 | *N* | *N + 1* | *N + 2* | *N + 3* |
| Odd | N + 7 | N + 3 | N + 4 | N + 5 | *N* | *N + 1* | *N + 2* | N + 6 | — |

Now consider the case where the degree of parallel access is n=4. This embodiment would have fourfold parallel accessing the extended length turbo-interleaver 434 at once, as opposed to twofold of the case n=2. An example of a parallel access sub decoder is shown at FIG. 2c. As with n=2, for the case of n=4 the length of the extended turbo interleaver is also dependent on the number of systematic bits N in the codeword and a number of tail bits. But in the case of n=4, the length specifically depends on the value of N modulo 4 (N mod 4). For the case of three tail bits as in the above non-limiting examples, and where the degree is n=4 of parallel accesses, there are four different basic cases to extend the length of the turbo interleaver depending on the value of N mod 4: 0, 1, 2, or 3. These are detailed separately below.

For the case N mod 4=1, the extended turbo interleaver TE 434 is defined by TE[N+k]=N+k+3 for k=0, 1, 2; is defined by TE[N+k]=N+k−3 for k=3, 4, 5; and is defined by TE[N+6]= N+6. The total length of the TE interleaver 434 is N+7. This is shown at row 4 of the table at FIG. 4c.

For the case N mod 4=2, the extended turbo interleaver TE 434 is defined by TE[N+k]=N+k+6 for k=0, 1, 2, 3; is defined by TE[N+k]=N+k for k=4, 5; and is defined by TE[N+k]=N+ k−6 for k=6, 7, 8, and 9. The total length of TE interleaver 434 is N+10. This is shown at row 1 of the table at FIG. 4c.

For the case N mod 4=3, the extended turbo interleaver TE 434 is defined by TE[N+k]=N+k+5 for k=0, 1, 2, 3; is defined by TE[N+k]=N+k for k=4, and is defined by TE[N+k]=N+ k−5 for k=5, 6, 7, and 8. The total length of the TE interleaver 434 is N+9. This is shown at row 2 of the table at FIG. 4c.

For the case N mod 4=0, the extended turbo interleaver TE 434 is defined by TE[N+k]=N+k+4 for k=0, 1, 2, 3; and is defined by TE[N+k]=N+k−4 for k=4, 5, 6, and 7. The total length of the TE interleaver 400 is N+8. This is shown at row 3 of the table at FIG. 4c.

The data of FIG. 4c is reproduced in table 2 below.

TABLE 2

3 tail bits and n = 4-tuple access for values of N mod 4

Values of TE at N, N + 1, . . . , N + 9.

| N mod 4 | Total Length | N | N + 1 | N + 2 | N + 3 | N + 4 | N + 5 | N + 6 | N + 7 | N + 8 | N + 9 |
|---|---|---|---|---|---|---|---|---|---|---|---|
| 2 | N + 10 | N + 6 | N + 7 | N + 8 | N + 9 | N + 4 | N + 5 | N | N + 1 | N + 2 | N + 3 |
| 3 | N + 9  | N + 5 | N + 6 | N + 7 | N + 8 | N + 4 | N     | N + 1 | N + 2 | N + 3 | —     |
| 0 | N + 8  | N + 4 | N + 5 | N + 6 | N + 7 | N     | N + 1 | N + 2 | N + 3 | —     | —     |
| 1 | N + 7  | N + 3 | N + 4 | N + 5 | N     | N + 1 | N + 2 | N + 6 | —     | —     | —     |

Addresses of dummy filler values can be assigned several different ways also when a degree of parallel processing is four. For example, the case N mod 4=2 the extended turbo interleaver can be defined by TE[N+k]=N+6+k and TE[N+6+k]=N+k for k=0, 1, 2; be defined by TE[N+k]=N+k for k=3, 4, 5; be defined by TE[N+9]=N+9. In other words, the last 10 value of the alternative extended turbo interleaver TE are [N+6, N+7, N+8, N+3, N+4, N+5, N, N+1, N+2, N+9], where two values that differ from Table 2 are in boldface.

The above can be extended to any number of n-tuple access, though most readily implemented at $2^m$ tuple multiple accesses, where m=1, 2, 3, 4, . . . the next of this series is then $n=2^3=8$-tuple parallel access, which has eight different extension parts for the TE interleaver 434 depending on a length N of the (conventional) turbo interleaver and a number of tail bits used in the encoding. Lengths of the extension parts vary from 11 to 18, as shown at FIG. 4d. Like FIG. 4c, each row of FIG. 4d shows values in the different address positions N, N+1, N+2, . . . N+17 of the extension portion of the interleaver according to the N mod 8 value which leads that row. The length $N_2$ of the extended interleaver TE depends on the value N mod 8. The same data of FIG. 4d is reproduced in table 3 below, with rows and columns inverted as compared to FIG. 4d. In an exemplary embodiment, the information of table 3 may be used to extend turbo interleavers for 3G mobile phones for the case where the length of the turbo interleaver is a multiple of the number n of the parallel processing/multiple access. This technique also takes into account the tail samples.

As in two cases where degrees of parallel processing are 2 and 4, addresses of dummy filler values can be assigned in a several way for the case degree of parallel processing is eight. To illustrate this, the data frame length N is taken such that N mod 8=1. Now $N_2=N+15$ and $N_1=N+7$. The last 15 values of the extended turbo interleaver can be assigned as N+7, N+8, N+9, N+3, N+4, N+5, N+6, N, N+1, N+2, N+10, N+11, N+12, N+13, N+14 where the addresses of dummy fillers are in boldface. This example on TE matches with the case N mod 8=1 in table 3 and the difference in addresses of dummy fillers is visible. Nevertheless, both types of extended turbo interleavers can be used. Soft bit values of dummy fillers can be assigned to values which represent a maximum probability of zero bits.

Embodiments of the invention may be implemented in an application specific integrated circuit ASIC such as one that includes the interleaver and decoders shown at FIG. 2b, whether arranged as depicted there or otherwise. The exemplary embodiments detailed herein are seen to be an area efficient implementation for high speed modems/decoders for turbo codes such as those stipulated for 3G and higher level protocols, either currently in use, under development, or yet to be developed as the implementation is adaptable to different turbo code structures. Embodiments of this invention may be employed in 3G modems for at least 64-QAM (quadrature amplitude modulation).

A sub turbo decoder in FIG. 2c is able to access a sub codeword in parallel: data values of the sub codeword are

TABLE 3

3 tail bits and n = 8-tuple access for values of N mod 8

N modulo 8

| TE[k] at k | 0 | 1 | 2 | 3 | 4 | 5 | 6 | 7 |
|---|---|---|---|---|---|---|---|---|
| N       | N + 8  | N + 7  | N + 6  | N + 5  | N + 4  | N + 3  | N + 10 | N + 9  |
| N + 1   | N + 9  | N + 8  | N + 7  | N + 6  | N + 5  | N + 4  | N + 11 | N + 10 |
| N + 2   | N + 10 | N + 9  | N + 8  | N + 7  | N + 6  | N + 5  | N + 12 | N + 11 |
| N + 3   | N + 11 | N + 10 | N + 9  | N + 8  | N + 7  | N      | N + 13 | N + 12 |
| N + 4   | N + 12 | N + 11 | N + 10 | N + 9  | N      | N + 1  | N + 14 | N + 13 |
| N + 5   | N + 13 | N + 12 | N + 11 | N      | N + 1  | N + 2  | N + 15 | N + 14 |
| N + 6   | N + 14 | N + 13 | N      | N + 1  | N + 2  | N + 6  | N + 16 | N + 15 |
| N + 7   | N + 15 | N      | N + 1  | N + 2  | N + 3  | N + 7  | N + 17 | N + 16 |
| N + 8   | N      | N + 1  | N + 2  | N + 3  | N + 8  | N + 8  | N + 8  | N + 8  |
| N + 9   | N + 1  | N + 2  | N + 3  | N + 4  | N + 9  | N + 9  | N + 9  | N      |
| N + 10  | N + 2  | N + 3  | N + 4  | N + 10 | N + 10 | N + 10 | N      | N + 1  |
| N + 11  | N + 3  | N + 4  | N + 5  | N + 11 | N + 11 | —      | N + 1  | N + 2  |
| N + 12  | N + 4  | N + 5  | N + 12 | N + 12 | —      | —      | N + 2  | N + 3  |
| N + 13  | N + 5  | N + 6  | N + 13 | —      | —      | —      | N + 3  | N + 4  |
| N + 14  | N + 6  | N + 14 | —      | —      | —      | —      | N + 4  | N + 5  |
| N + 15  | N + 7  | —      | —      | —      | —      | —      | N + 5  | N + 6  |
| N + 16  | —      | —      | —      | —      | —      | —      | N + 6  | N + 7  |
| N + 17  | —      | —      | —      | —      | —      | —      | N + 7  | —      |
| Total Length | N + 16 | N + 15 | N + 14 | N + 13 | N + 12 | N + 11 | N + 18 | N + 17 | processed in chunks of n data values. So n-tuples of systematic data values, n-tuples of extrinsic values, and n-tuples of parity values.

Figure 5:
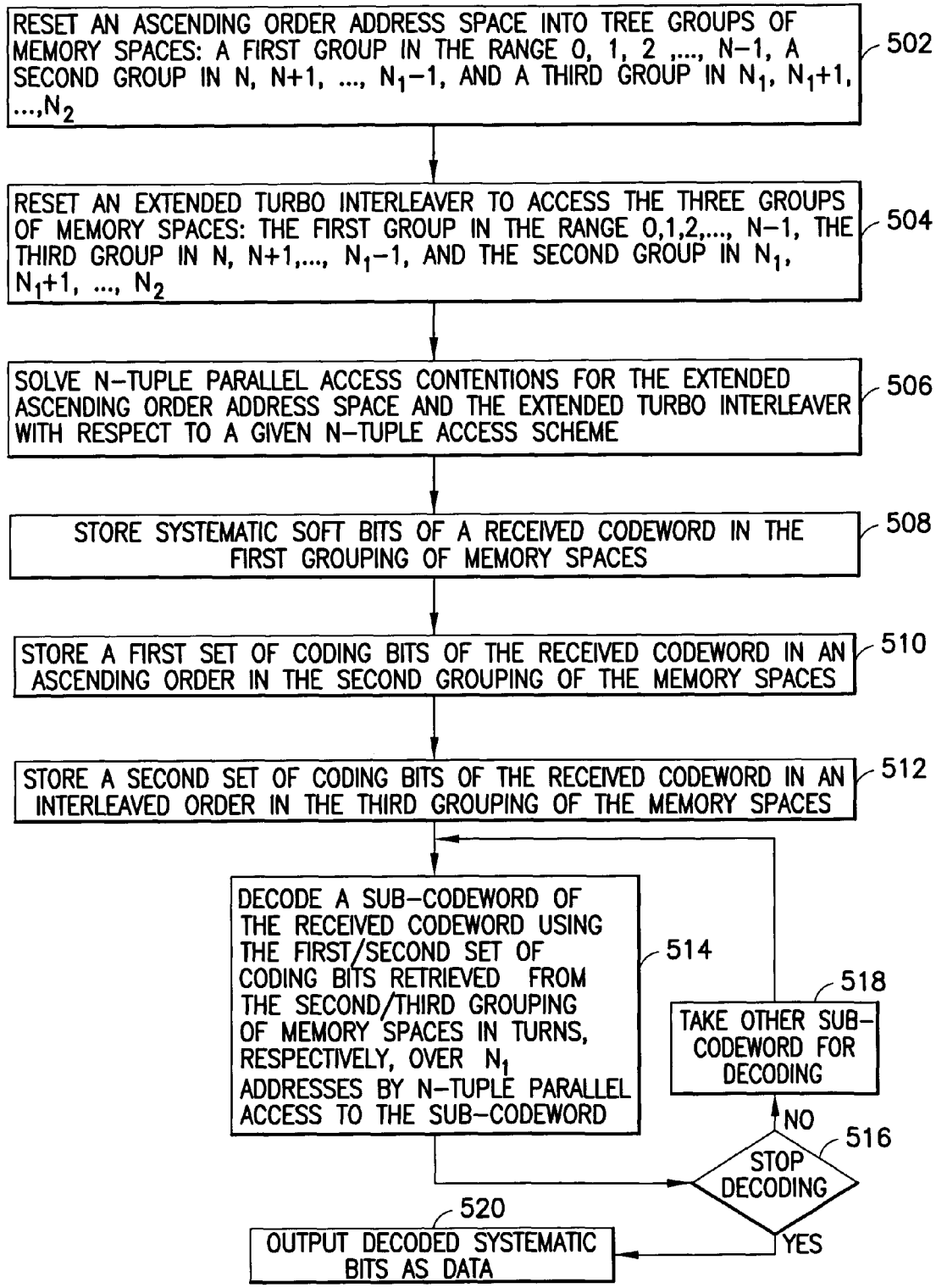
FIG. 5 is a process flow diagram illustrating the operation of a method, and a result of execution of computer program instructions embodied on a computer readable memory, in accordance with exemplary embodiments of this invention.

FIG. 5 illustrates a logic flow diagram according to an exemplary embodiment of the invention, and FIG. 2c illustrates a turbo decoder in block schematic view according to an exemplary embodiment of the invention to illustrate the process of FIG. 5. At block 502 an ascending order address space is divided into three disjoint parts. A first group matches addresses in the range $0, 1, 2, \ldots, N-1$, a second group does addresses in the range $N, N+1, \ldots, N_1-1$, and a third group does the range $N_1, N_1+1, \ldots, N_2-1$. Next we reset at block 504 an extended interleaver such that the extended interleaver is able to access data values in the first group in the range $0, 1, 2, \ldots, N-1$, data values in the third group in the range $N, N+1, \ldots, N_1-1$, and data values in the second group in the range $N_1, N_1+1, \ldots, N_2-1$. A detailed structure of an actual extended interleaver may be as in FIG. 4b. Because the three lengths $N, N_1$, and $N_2$ depends on a number of systematic soft bits and soft tails bits, the steps 502 and 504 may be executed by a programmable processor 250 together with an address unit 254. Then at block 506 parallel access contentions to the memory spaces are solved, illustrated in FIG. 2c by the parallel access contention solver unit 256, for example by invoking the methods of the U.S. patent application Ser. No. 11/810,119, filed on Jun. 4, 2007 and entitled "Multiple Access for Parallel Turbo Decoder".

Next a received codeword is downloaded to memories of a turbo decoder by sorting systematic soft bits, as seen in blocks 508, 510, and 512, into three groups according to which parts of the codeword systematic soft bits belong to. The soft bits 220 are put into the first grouping of the memory spaces at block 508, the soft tail bits 226 are put into the second grouping of the memory spaces at block 510, and finally, the other soft tail bits 232 are put into the third grouping of the memory spaces at block 512. The second and third grouping of the memory spaces may contain also extra filler values in order to fill possible incomplete n-tuples full and they match with extra addresses of the extended ascending order address space. The address unit 254 and the memory 258 may be used to execute these operations.

Now a parallel access sub-codeword decoder 260 is initiated by decoding sub-codewords in turns at block 514 until a maximum number of rounds has been done or some other stop condition represented by block 516 is met. After decoding a sub-codeword, a next round will use the other sub-codeword at block 518 for decoding. When the parallel access sub-codeword decoder 260 decodes an ascending order sub-codeword, the address unit 254 provides the ascending order addresses in n-tuples and control bits for a butterfly network. Similarly, when the parallel access sub-codeword decoder 260 decodes an interleaved order sub-codeword, the address unit 254 generates the interleaved order addresses in n-tuples and control bits for a butterfly network.

In general, the various exemplary embodiments may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the exemplary embodiments of this invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

It should thus be appreciated that at least some aspects of the exemplary embodiments of the inventions may be practiced in various components such as integrated circuit chips and modules, and that the exemplary embodiments of this invention may be realized in an apparatus that is embodied as an integrated circuit. The integrated circuit, or circuits, may comprise circuitry (as well as possibly firmware) for embodying at least one or more of a data processor or data processors, a digital signal processor or processors, baseband circuitry and radio frequency circuitry that are configurable so as to operate in accordance with the exemplary embodiments of this invention.

Various modifications and adaptations to the foregoing exemplary embodiments of this invention may become apparent to those skilled in the relevant arts in view of the foregoing description, when read in conjunction with the accompanying drawings. However, any and all modifications will still fall within the scope of the non-limiting and exemplary embodiments of this invention.

For example, while the exemplary embodiments have been described above in the context of the 3G radio access technology system, it should be appreciated that the exemplary embodiments of this invention are not limited for use with only this one particular type of wireless communication system, and that they may be used to advantage in other wireless communication systems such as for example WLAN, UTRAN, E-UTRAN, GSM, EDGE2, etc.

It should be noted that the terms "connected," "coupled," or any variant thereof, mean any connection or coupling, either direct or indirect, between two or more elements, and may encompass the presence of one or more intermediate elements between two elements that are "connected" or "coupled" together. The coupling or connection between the elements can be physical, logical, or a combination thereof. As employed herein two elements may be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

Furthermore, some of the features of the various non-limiting and exemplary embodiments of this invention may be used to advantage without the corresponding use of other features. As such, the foregoing description should be considered as merely illustrative of the principles, teachings and exemplary embodiments of this invention, and not in limitation thereof.

What is claimed is:

1. A method comprising:
  generating a first grouping of memory space addresses for systematic bits of a received codeword;
  generating a second grouping of memory space addresses for a first set of coding bits of the received codeword, wherein the first set of coding bits comprises an ascending order;
  generating a third grouping of memory space addresses for a second set of coding bits of the received codeword, wherein the second set of coding bits comprises an interleaved order; and
  decoding a sub-codeword of the received codeword in parallel by accessing the first set of coding bits using the addresses in the second grouping of memory spaces and in turn decoding another sub-codeword of the received codeword in parallel by accessing the second set of coding bits using the addresses in the third grouping of memory spaces.

2. The method according to claim 1, wherein the coding bits comprise soft tail bits, and the addresses of memory spaces are disposed within an interleaver such that the addresses of the soft tail bits in the third grouping lies between the addresses of the soft tail bits in the second grouping and the addresses of the systematic bits in the first grouping.

3. The method according to claim 1, wherein the addresses of the first grouping are at positions $0, 1, \ldots, N-1$ within an interleaver, the addresses of the third grouping are at positions $N, N+1, \ldots, N_1-1$ within the interleaver, and the addresses of the second grouping are at positions $N_1, N_1+1, \ldots, N_2-1$ within the interleaver, wherein $N_1$ is a least integer number such that:

$N_1$ is a multiple of a degree of parallel processing/access; and $N_1-N$ is larger than or equal to a maximum number of tail bits of the sub-codewords;

and wherein $N_2$ is a least integer number such that $N_2$ is a multiple of the degree of parallel processing/access; and $N_2-N_1$ is larger than or equal to a maximum number of tail bits of the sub-codewords.

4. The method according to claim 3, wherein the addresses of soft tail bits stored in the third grouping of the memory spaces are within the interleaver at positions $N, N+1, N+2$ and the addresses of soft tail values stored in the second grouping of the memory spaces are within the interleaver at positions $N_1, N_1+1, N_1+2$.

5. The method according to claim 1, wherein the sub-codewords are decoded in twofold parallel access; there are N systematic soft bits; $N_1=N+4$ and the length $N_2$ of the memory spaces equal $N+8$ for the case where N is an even number; and $N_1=N+3$ and the length $N_2$ of the memory spaces equal $N+7$ for the case where N is an odd number;

and wherein the addresses of soft tail bits stored in the third grouping of the memory spaces are within the interleaver at positions $N, N+1, \ldots, N_2-5$ and the addresses of the soft tail values stored in the second grouping of the memory spaces are within the interleaver at positions $N_2-4, N_2-3, \ldots, N_2-1$.

6. The method according to claim 1, wherein the sub-codewords are decoded in fourfold parallel access; there are N systematic bits; length $N_1$ and length $N_2$ of the memory spaces are selected from one of the following:

$N_1=N+6$ and $N_2=N+10$ for the case where N mod 4=2;
$N_1=N+5$ and $N_2=N+9$ for the case where N mod 4=3;
$N_1=N+4$ and $N_2=N+8$ for the case where N mod 4=0; and
$N_1=N+3$ and $N_2=N+7$ for the case where N mod 4=1;

and wherein the addresses of soft tail bits stored in the third grouping of the memory spaces are within an interleaver at positions $N, N+1, \ldots, N_2-5$ and the addresses of the soft tail bits stored in the second grouping of the memory spaces are within the interleaver at positions $N_2-4, N_2-3, \ldots, N_2-1$.

7. The method according to claim 1, wherein the sub-codewords are decoded in eightfold parallel access; there are N systematic bits; and length $N_1$ and the length $N_2$ of the memory spaces are selected from one of the following:

$N_1=N+8$ and $N_2=N+16$ for the case where N mod 8=0;
$N_1=N+7$ and $N_2=N+15$ for the case where N mod 8=1;
$N_1=N+6$ and $N_2=N+14$ for the case where N mod 8=2;
$N_1=N+5$ and $N_2=N+13$ for the case where N mod 8=3;
$N_1=N+4$ and $N_2=N+12$ for the case where N mod 8=4;
$N_1=N+3$ and $N_2=N+11$ for the case where N mod 8=5;
$N_1=N+10$ and $N_2=N+18$ for the case where N mod 8=6; and
$N_1=N+9$ and $N_2=N+17$ for the case where N mod 8=7;

and wherein the addresses of soft tail bits stored in the third grouping of the memory spaces are within an interleaver at positions $N, N+1, \ldots, N_2-9$ and the addresses of soft tail bits stored in the second grouping of the memory spaces are within the interleaver at positions $N_2-8, N_2-7, \ldots, N_2-1$.

8. An apparatus comprising:

a memory comprising a first grouping of memory space addresses at which are stored systematic bits of a received codeword, a second grouping of memory space addresses at which are stored a first set of coding bits of the received codeword in an ascending order, and a third grouping of memory space addresses at which are stored a second set of coding bits of the received codeword in an interleaved order;

a first decoder configured to decode a sub-codeword of the received codeword in parallel using the first set of coding bits retrieved from the second grouping of memory spaces; and a second decoder, configured to decode in turn with the first decoder and in parallel access to the memory space addresses, another sub-codeword of the received codeword using the second set of coding bits retrieved from the third grouping of memory spaces.

9. The apparatus according to claim 8, wherein coding bits comprise soft tail bits, and the addresses of the memory spaces are disposed within an interleaver such that the addresses of the soft tail bits in the third grouping lies between the addresses of the soft tail bits in the second grouping and the addresses of the systematic bits in the first grouping.

10. The apparatus according to claim 8, wherein the addresses of the first grouping are at positions $0, 1, \ldots, N-1$ within an interleaver, the addresses of the third grouping are in positions $N, N+1, N_1-1$ within the interleaver, and the addresses of the second grouping are at positions $N_1, N_1+1, \ldots, N_2-1$ within the interleaver, wherein $N_1$ is a least integer number such that:

$N_1$ is a multiple of a degree of parallel processing/access; and $N_1-N$ is larger than or equal to a maximum number of tail bits of the sub-codewords;

and wherein $N_2$ is a least integer number such that $N_2$ is a multiple of the degree of parallel processing/access; and $N_2-N_1$ is larger than or equal to a maximum number of tail bits of the sub-codewords.

11. The apparatus according to claim 10, wherein the addresses of soft tail bits stored in the third grouping of the memory spaces are within the interleaver at positions $N, N+1, N+2$ and the addresses of soft tail values stored in the second grouping of the memory spaces are within the interleaver at positions $N_1, N_1+1, N_1+2$.

12. The apparatus according to claim 8, wherein the first and second decoders are configured to decode the sub-codewords in twofold parallel access; there are N systematic soft bits; $N_1=N+4$ and the length $N_2$ of the memory spaces equal $N+8$ for the case where N is an even number; and $N_1=N+3$ and the length $N_2$ of the memory spaces equal $N+7$ for the case where N is an odd number;

and wherein the addresses of soft tail bits stored in the third grouping of the memory spaces are within the interleaver at positions $N, N+1, \ldots, N_2-5$ and the addresses of the soft tail values stored in the second grouping of the memory spaces are within the interleaver at positions $N_2-4, N_2-3, \ldots, N_2-1$.

13. The apparatus according to claim 8, wherein the first and second decoders are configured to decode the sub-codewords in fourfold parallel access; there are N systematic bits; length $N_1$ and length $N_2$ of the memory spaces are selected from one of the following:

$N_1=N+6$ and $N_2=N+10$ for the case where N mod 4=2;
$N_1=N+5$ and $N_2=N+9$ for the case where N mod 4=3;
$N_1=N+4$ and $N_2=N+8$ for the case where N mod 4=0; and
$N_1=N+3$ and $N_2=N+7$ for the case where N mod 4=1;

and wherein the addresses of soft tail bits stored in the third grouping of the memory spaces are within an interleaver at positions N, N+1, ..., $N_2-5$ and the addresses of the soft tail bits stored in the second grouping of the memory spaces are within the interleaver at positions $N_2-4, N_2-3, ..., N_2-1$.

14. The apparatus according to claim 8, wherein the first and second decoders are configured to decode the sub-codewords in eightfold parallel access; there are N systematic bits; and length $N_1$ and the length $N_2$ of the memory spaces are selected from one of the following:

$N_1=N+8$ and $N_2=N+16$ for the case where N mod 8=0;
$N_1=N+7$ and $N_2=N+15$ for the case where N mod 8=1;
$N_1=N+6$ and $N_2=N+14$ for the case where N mod 8=2;
$N_1=N+5$ and $N_2=N+13$ for the case where N mod 8=3;
$N_1=N+4$ and $N_2=N+12$ for the case where N mod 8=4;
$N_1=N+3$ and $N_2=N+11$ for the case where N mod 8=5;
$N_1=N+10$ and $N_2=N+18$ for the case where N mod 8=6; and
$N_1=N+9$ and $N_2=N+17$ for the case where N mod 8=7;

and wherein the addresses of soft tail bits stored in the third grouping of the memory spaces are within an interleaver at positions N, N+1, ..., $N_2-9$ and the addresses of soft tail bits stored in the second grouping of the memory spaces are within the interleaver at positions $N_2-8, N_2-7, ..., N_2-1$.

15. A computer readable memory storing a program of executable instructions that when executed by a processor perform actions directed to decoding a codeword, the actions comprising:

generating a first grouping of memory space addresses for systematic bits of a received codeword;

generating a second grouping of memory space addresses for a first set of coding bits of the received codeword, wherein the first set of coding bits comprises an ascending order;

generating a third grouping of memory space addresses for a second set of coding bits of the received codeword, wherein the second set of coding bits comprises an interleaved order; and decoding a sub-codeword of the received codeword in parallel by accessing the first set of coding bits using the addresses in the second grouping of memory spaces and in turn decoding another sub-codeword of the received codeword in parallel by accessing the second set of coding bits using the addresses in the third grouping of memory spaces.

16. The computer readable memory according to claim 15, wherein the coding bits comprise soft tail bits, and the addresses of memory spaces are disposed within an interleaver such that the addresses of the soft tail bits in the third grouping lies between the addresses of the soft tail bits in the second grouping and the addresses of the systematic bits in the first grouping.

17. The computer readable memory according to claim 15, wherein the addresses of the first grouping are at positions 0, 1, ..., N−1 within an interleaver, the addresses of the third grouping are at positions N, N+1, ..., $N_1-1$ within the interleaver, and the addresses of the second grouping are at positions $N_i, N_1+1, ..., N_2-1$ within the interleaver, wherein $N_1$ is a least integer number such that:

$N_1$ is a multiple of a degree of parallel processing/access; and $N_1-N$ is larger than or equal to a maximum number of tail bits of the sub-codewords;

and wherein $N_2$ is a least integer number such that $N_2$ is a multiple of the degree of parallel processing/access; and $N_2-N_1$ is larger than or equal to a maximum number of tail bits of the sub-codewords.

18. The computer readable memory according to claim 17, wherein the addresses of soft tail bits stored in the third grouping of the memory spaces are within the interleaver at positions N, N+1, N+2 and the addresses of soft tail values stored in the second grouping of the memory spaces are within the interleaver at positions $N_1, N_1+1, N_1+2$.

19. The computer readable memory according to claim 15, wherein the sub-codewords are decoded in twofold parallel access; there are N systematic soft bits; $N_1=N+4$ and the length $N_2$ of the memory spaces equal N+8 for the case where N is an even number; and $N_1=N+3$ and the length $N_2$ of the memory spaces equal N+7 for the case where N is an odd number;

and wherein the addresses of soft tail bits stored in the third grouping of the memory spaces are within the interleaver at positions N, N+1, ..., $N_2-5$ and the addresses of the soft tail values stored in the second grouping of the memory spaces are within the interleaver at positions $N_2-4, N_2-3, ..., N_2-1$.

20. The computer readable memory according to claim 15, wherein the sub-codewords are decoded in fourfold parallel access; there are N systematic bits; length $N_1$ and length $N_2$ of the memory spaces are selected from one of the following:

$N_1=N+6$ and $N_2=0$ for the case where N mod 4=2;
$N_1=N+5$ and $N_2=N+9$ for the case where N mod 4=3;
$N_1=N+4$ and $N_2=N+8$ for the case where N mod 4=0; and
$N_1=N+3$ and $N_2=N+7$ for the case where N mod 4=1;

and wherein the addresses of soft tail bits stored in the third grouping of the memory spaces are within an interleaver at positions N, N+1, ..., $N_2-5$ and the addresses of the soft tail bits stored in the second grouping of the memory spaces are within the interleaver at positions $N_2-4, N_2-3, ..., N_2-1$.

* * * * *

UNITED STATES PATENT AND TRADEMARK OFFICE
CERTIFICATE OF CORRECTION

PATENT NO. : 7,839,310 B2  
APPLICATION NO. : 12/378998  
DATED : November 23, 2010  
INVENTOR(S) : Nieminen Page 1 of 1

It is certified that error appears in the above-identified patent and that said Letters Patent is hereby corrected as shown below:

Claim 17, column 18, line 11, please delete "$N_i$" and replace with --$N_1$--.

Claim 20, column 18, line 45, after "=" please delete "0" and replace with --N+10--.

Signed and Sealed this
Eighth Day of February, 2011

David J. Kappos
*Director of the United States Patent and Trademark Office*